United States Patent [19]
Huetson et al.

[11] Patent Number: 5,414,219
[45] Date of Patent: May 9, 1995

[54] PRINTED CIRCUIT BOARD CIRCUIT CONTROL DEVICE

[75] Inventors: Curtis L. Huetson, Westminster; Rick D. Jussel, Broomfield, both of Colo.

[73] Assignee: AT&T Corp., Murray Hill, N.J.

[21] Appl. No.: 232,791

[22] Filed: Apr. 22, 1994

[51] Int. Cl.6 .............................................. H05K 1/00
[52] U.S. Cl. ..................................... 174/250; 174/262; 174/267; 174/268; 228/180.1; 361/774; 361/775; 361/777; 361/778
[58] Field of Search ................ 174/250, 260, 262, 267, 174/268; 228/179, 180.1; 361/760, 767, 774, 775, 777, 778

[56] References Cited
U.S. PATENT DOCUMENTS 3,859,196  1/1975  Ruthel et al. .
3,923,359  12/1975  Newsam .
4,785,141  11/1988  Nishihara et al. .
5,043,534  8/1991  Mahulikar et al. .

Primary Examiner—Leo P. Picard
Assistant Examiner—Cheryl R. Figlin

[57] ABSTRACT

A circuit control device includes two intermating foil pads separated from one another by a narrow gap having a maximum dimension of 0.006 inches. A circuit path having one side connected to one of the pads and a second side connected to the other of the pads is selectively closed and opened by solder application and removal operations. Interdigitated, triangular fingers which are intermated to form the device ensure the formation of acutely angled junctures along the gap to ensure solder bridging of the gap. Emergency control elements are coupled to the circuit control device to permit control of an associated circuit path if the circuit control device itself fails. In that event, an emergency control device is coupled to the emergency control elements to control opening and closing of the circuit path.

20 Claims, 2 Drawing Sheets

PRINTED CIRCUIT BOARD CIRCUIT CONTROL DEVICE

BACKGROUND OF THE INVENTION

The present invention relates in general to devices for selectively opening and closing electrical circuits on a printed circuit board (PCB) and, more particularly, to a solder controlled device which presents an open circuit until initially soldered, for example by surface mount stencil print/reflow or through-hole wave solder processes, and thereafter can be opened by removing solder from the device and reclosed by reapplying solder to the device.

Many circuits embodied in printed circuit boards require temporary breaks or opens in one or more paths of the circuits. Currently, these breaks or opens are commonly provided by inserting switches or header/jumper devices into the circuit paths. Oftentimes, circuit breaks or opens are only required once or a limited number of times, for example for initial testing or installation of factory options on the circuit boards. For circuits requiring such a limited number of open/close operations, switches and/or header/jumper devices are overkill and add substantially to the cost of an assembled circuit board. In addition, if switches or two piece header/jumper devices are used, not only are they relatively expensive but there is a probability that the assembly person will forget to properly set the switches, fail to install the jumpers or will install the jumpers in the wrong position.

It is apparent that there is a need for a printed circuit board circuit control device which is inexpensive, reliable over a limited number of open/close operations and can be initially closed by means of conventional printed circuit board soldering operations. Preferably, the circuit control device would also provide emergency control elements which could be used to control closure of the circuit path in the event of failure of the circuit control device itself.

SUMMARY OF THE INVENTION

This need is met by the circuit control device of the present invention wherein two intermating foil pads, created during conventional manufacture of the printed circuit board, are separated from one another by a narrow gap having a maximum dimension of 0.006 inches such that a circuit having one side connected to one of the pads and a second side connected to the other of the pads can be selectively closed and opened by soldering operations. In particular, the circuit is initially open due to the gap between the two foil pads. The circuit is closed by soldering the two foil pads such that the gap separating the two pads is bridged, for example by an automated soldering process conventionally used to produce a completed printed circuit board.

If the circuit needs to be later opened, for example for testing, installation of factory options or repair, the solder can be removed from the circuit control device to clear the gap and thereby reopen the circuit. Once operations requiring the circuit to be open are performed, the circuit can be reclosed for normal operation by resoldering the circuit control device. For best results, the gap includes angled transitions, turns or junctures, preferably acutely angled, which facilitate solder bridging the gap including the turns. Interdigitated, triangular fingers which are intermated to form the device ensure the formation of such junctures along the gap; however, other geometric configurations also may be used.

Emergency control elements may be coupled to the circuit control device to permit control of an associated circuit path in the event the circuit control device itself fails. For example, if more opening and closing operations than anticipated were required for a given circuit control device, the foil pads may separate from the printed circuit board resulting in failure of the device. In that event an emergency control device would be coupled to the emergency control elements to control opening and closing of the circuit. In this way, failed circuit control devices would not result in loss of the printed circuit board or unusual and possibly unreliable repairs.

In accordance with one aspect of the present invention, a circuit control device for a printed circuit board comprises a first foil pad secured to the circuit board and electrically connected to a first side of an electrical circuit to be selectively opened and closed by the circuit control device, and a second foil pad secured to the circuit board and electrically connected to a second side of the electrical circuit to be selectively opened and closed by the circuit control device. The first and second foil pads are separated from one another by a gap which is bridged by solder during an automated solder processing of the printed circuit board to close the electrical circuit, the circuit control device being opened by removal of the solder and reclosed by replacement of the solder.

To permit a reasonable but limited number of opening and closing operations to be performed by the circuit control device, the first and second foil pads are sized to remain secured to the printed circuit board through a plurality of soldering and desoldering operations. To ensure proper operation of the circuit control device using automated soldering processes, the gap should be a maximum of 0.006 of an inch.

A variety of configurations of the foil pads can be utilized. In one form, the first and second foil pads form interdigitated portions. In another form, the first and second foil pads form juxtaposed fingers. For these and other forms, the first and second foil pads may comprise buses separated from one another by interdigitated fingers alternately extending from the buses, the fingers being separated from one another by the gap.

The first foil pad may comprise a first bus and the second foil pad may comprise a second bus with the foil pads each further comprising at least one finger extending therefrom and pointing toward the other foil pad. The fingers are then separated from one another and from the foil pads which they face by the gap. The fingers may be generally triangular in shape and connected to their corresponding bus by a triangle vertex. This configuration ensures that the gap defines at least one angular juncture to ensure solder bridging between the first and second foil pads. And, in fact, ensures that at least one of the at least one angular juncture defines an acute angle.

Preferably, the circuit control device further comprises emergency control elements electrically connected to the first and second foil pads for receiving an emergency control device for electrically connecting the first side of the electrical circuit to the second side of the electrical circuit. The emergency control elements may comprise a first conductor receiving pad connected to the first foil pad for receiving a first end of an emergency control device, and a second conductor receiving pad connected to the second foil pad for receiving a second end of an emergency control device. The emergency control device may comprise an electrically conducting strap, a header jumper pair, a switch or other appropriate device.

In accordance with another aspect of the present invention, a device for opening and closing a circuit path on a printed circuit board comprises a first foil pad connected to a first side of the circuit path to be opened and closed by the device, and a second foil pad connected to a second side of the circuit path to be opened and closed by the device. The first and second foil pads are separated by a gap which is bridged by solder to close the circuit path and cleared of solder to open the circuit path.

To permit a reasonable but limited number of opening and closing operations to be performed by the circuit control device, the first and second foil pads are sized to remain secured to the printed circuit board after a plurality of soldering and desoldering operations. The gap defines at least one sharply pointed juncture to ensure solder bridging between the first and second foil pads. The first foil pad may define a first bus and at least one generally triangular peninsular area connected to the first bus by a vertex of the peninsular area of the first foil pad such that it expands as it extends from the first bus. For this configuration, the second foil pad defines a second bus and at least one generally triangular peninsular area connected to the second bus by a vertex of the peninsular area of the second foil pad such that it expands as it extends from the second bus. The at least one generally triangular peninsular areas of the first and second buses are formed to interengage with one another such that the gap is formed between the triangular peninsular areas.

It is thus an object of the present invention to provide a circuit control device wherein two intermating foil pads are separated from one another by a narrow gap such that a circuit having one side connected to one of the pads and a second side connected to the other of the pads can be selectively closed and opened by soldering operations; to provide a circuit control device wherein two intermating foil pads are separated from one another by a narrow gap which is formed at least between triangular, interdigitated fingers to define sharply angled junctures along the gap to ensure solder bridging of the gap; and, to provide a circuit control device wherein two intermating foil pads are separated from one another by a narrow gap which is bridged by solder for closure of a circuit path and including emergency control elements coupled to the circuit control device to permit control of an associated circuit path in the event the circuit control device itself fails.

Other objects and advantages of the invention will be apparent from the following description, the accompanying drawings and the appended claims.

DETAILED DESCRIPTION OF THE INVENTION

Figure 1A:
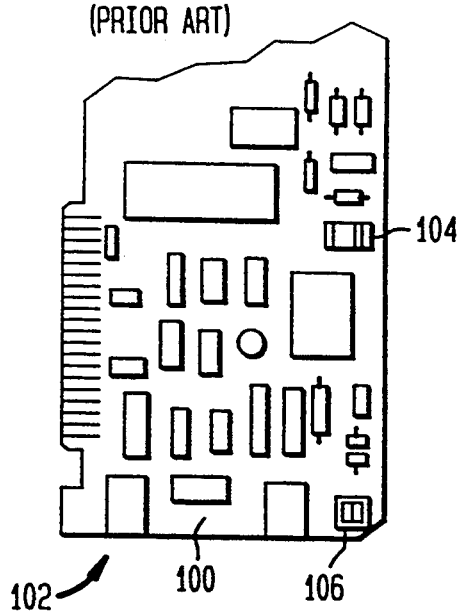
FIG. 1A is a plan view of a printed circuit board illustrating the prior art of circuit path control or switching.

The printed circuit board circuit control device of the present application will now be described with reference to the drawing figures wherein FIG. 1A is a broken-away plan view of a printed circuit board 100 illustrating prior art circuit path control devices. In FIG. 1A, the printed circuit board 100 includes a variety of circuit components 102 including integrated circuits, resistors, diodes, capacitors, inductors and the like. In addition, a header/jumper device 104 and a board mounted slide switch 106 are shown as being supported on the top side of the printed circuit board 100 for selectively opening and closing printed circuit paths on the printed circuit board 100.

Figure 1B:
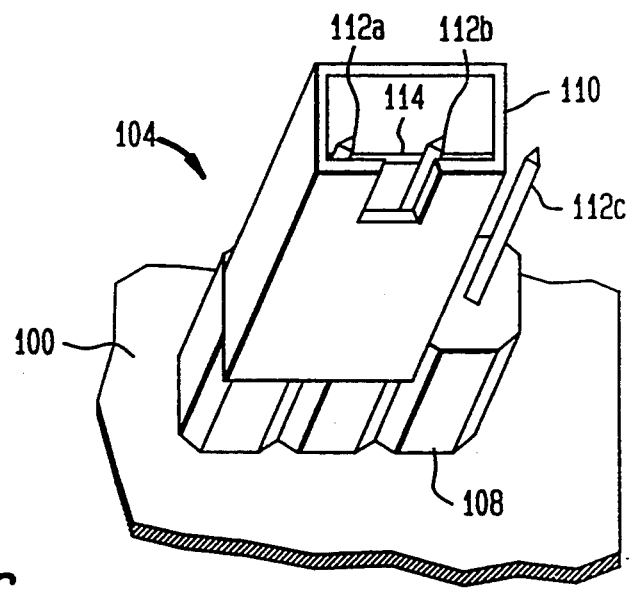
FIG. 1B is a perspective view of a header/jumper device used on the printed circuit board of FIG. 1A.

The header/jumper device 104 is shown on an enlarged scale in FIG. 1B as including a header 108 and a jumper 110. The header 108 includes electrical conductor pins 112a, 112b and 112c which are molded within the header 108 and extend above the header 108. The pins 112a, 112b and 112c also extend below the header 108 and through openings in the printed circuit board 100 such that they can be electrically connected to conductor receiving pads (not shown). In this way, the header 108 is mounted on the printed circuit board 100 by means of conventional manual or automated soldering processes such that the electrical conductor pins 112a, 112b and 112c electrically extend corresponding circuit paths above the printed circuit board 100.

Electrical connections of the circuit paths extended above the printed circuit board 100 by the electrically conducting pins 112a, 112b and 112c are made by the jumper 110. The jumper 110 includes an electrically conductive bridge 114 which is forced into engagement with whichever two pins are received within the jumper 110 such the two pins and the interconnected electrical circuit paths are electrically conducted to one another. In the illustrated header/jumper device 104, three circuit paths are extended above the printed circuit board 100 such that the circuit path connected to the center pin 112b can be connected to either the circuit path connected to the left pin 112a or the circuit path connected to the right pin 112c by means of the jumper 110.

As shown in FIG. 1B, the header 110 has been forced down over the electrical conductor pins 112a and 112b to interconnect the pins 112a and 112b and also the corresponding electrical circuit paths which are connected to the portions of the pins 112a and 112b which extend into the printed circuit board 100. It is noted that the circuit paths may be on either side of the printed circuit board 100 or indeed within the printed circuit board 100 in the case of multiple layer boards which are commonly utilized.

If the center pin 112b it to be connected to the circuit path connected to the right pin 112c, the jumper 110 is removed from the pins 112a and 112b, and forced over the pins 112b and 112c. Of course, if only first and second sides of a circuit path are to be connected, a two conductor header can be used with the circuit path being open if the jumper 100 is removed and closed if the jumper 110 is forced over the two pins.

Figure 1C:
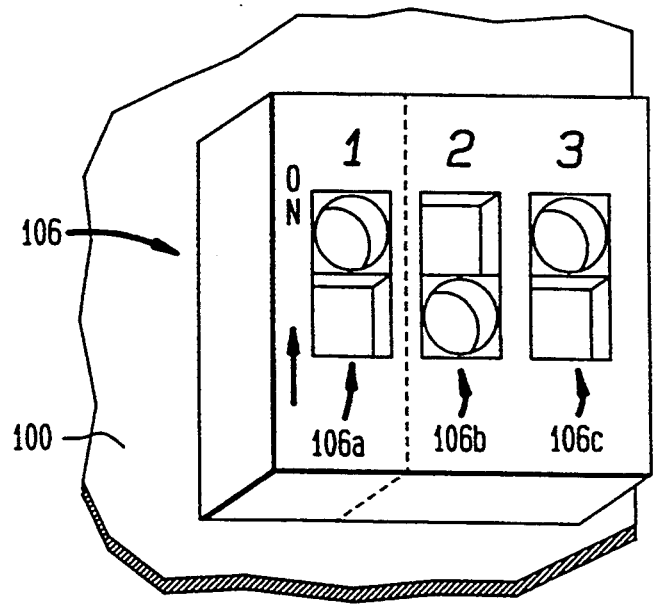
FIG. 1C is a perspective view of a printed circuit board switch used on the printed circuit board of FIG. 1A; and, FIG. 2 is a layout drawing of an illustrative embodiment of a printed circuit board circuit control device in accordance with the present invention.

The board mounted slide switch 106 is shown on an enlarged scale in FIG. 1C. The illustrated switch includes three single pole single throw switches 106a, 106b and 106c such that there are connection points for six different electrical circuit points to the switch 106. The three switches 106a, 106b and 106c are labeled 1, 2 and 3 in FIG. 1C with switches 106a and 106c being in their on positions and switch 106b being in its off position. Of course, if first and second sides of a single electrical circuit path were to be controlled, a switch including only one single pole single throw switch, such as the switch 106a, could be utilized as indicated by the dashed line in FIG. 1C.

As should be apparent, the cost of the header/jumper device 104 and the slide switch 106, even a single slide switch such as the switch 106a, is relatively expensive when compared to a portion of the electrical conductor which forms circuit paths on the printed circuit board 100. In addition where switches or two piece header/jumper devices are used, not only are they relatively expensive but there is a probability that the assembly person will forget to properly set the switches, fail to install the jumpers or will install the jumpers in the wrong position.

Figure 2:
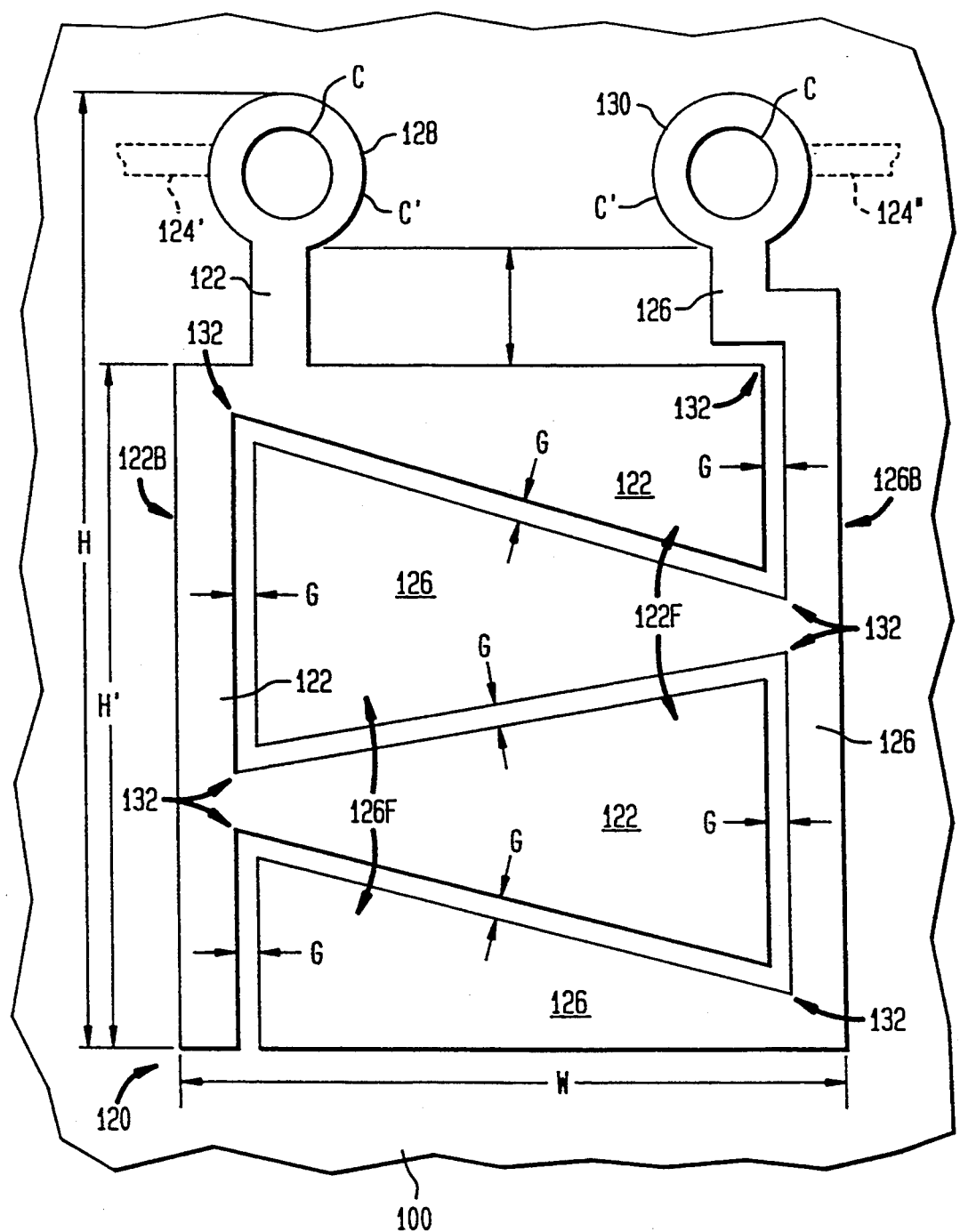

An illustrative layout drawing of a printed circuit board circuit control device 120 in accordance with the invention of the present application formed of printed circuit conductor material is shown in FIG. 2. The circuit control device 120 comprises a first foil pad 122 secured to the circuit board 100 and electrically connected to a first side 124' of an electrical circuit 124 to be selectively opened and closed by the circuit control device 120. A second foil pad 126 is secured to the circuit board 100 and electrically connected to a second side 124" of the electrical circuit 124. It is noted that the first and second foil pads 122, 126 are secured to the circuit board 100 in that they are created during conventional manufacturing processes used in making the circuit board 100, i.e., no additional processing steps are required for their creation.

The first and second foil pads 122, 126 are separated from one another by a gap G which is bridged by solder during an automated solder processing of the printed circuit board 100 to close the electrical circuit 124 by electrically connecting the first side 124' of the circuit 124 to the second side 124" of the circuit 124. The circuit control device 120 is opened by removal of solder bridging the gap G and reclosed by replacement of solder bridging the gap G.

The first and second foil pads 122, 126 are sized to remain secured to the printed circuit board 100 through a plurality of soldering and desoldering operations. As shown in FIG. 2, the illustrated embodiment of the circuit control device 120 is approximately and preferably 0.170 inches in width W; approximately and preferably 0.254 inches in height H including emergency control elements 128, 130 which will be fully described hereinafter; approximately and preferably 0.150 inches in height H' of the interdigitated or interlaced portions of the circuit control device 120; and, a maximum gap G of approximately and preferably 0.006 inches. The disclosed sizing will withstand approximately 4–6 soldering/desoldering operations without substantial separation of the first and second foil pads 122, 126 from the printed circuit board 100.

As shown in the illustrated embodiment of FIG. 2, the first and second foil pads 122, 126 comprise generally parallel buses 122B and 126B, respectively. The parallel buses 122B and 126B are separated from one another by interlaced or interdigitated fingers 122F and 126F alternately extending from the parallel buses 122B and 126B, respectively. The fingers 112F and 126F are separated from one another by the gap G and also separated from the foil pad to which they are not connected by the gap G.

For best results, the gap G includes angled transitions, turns or junctures 132 which facilitate solder bridging the gap G including the junctures. Preferably, the angled junctures 132 are acutely angled. Making the interlaced or interdigitated fingers 122F and 126F triangular in form with connections to the parallel buses 122B and 126B at vertices of the triangles and intermating the fingers 122F and 126F to form the circuit control device 120 ensures the formation of preferred acutely angled junctures along the gap G.

Preferably, the emergency control elements 128, 130 are coupled or electrically connected to the first and second foil pads 122, 126, respectively, of the circuit control device 120 to permit control of an associated circuit path, such as the circuit path 124, in the event the circuit control device 120 fails. For example, if more opening and closing operations than anticipated are required for a given circuit control device, the foil pads 122, 126 may separate from the printed circuit board 100 resulting in failure of the device 120.

In that event an emergency control device, such as the header/jumper device 104 or the board mounted slide switch 106, are coupled to the emergency control elements 128, 130 to control opening and closing of the circuit path 124. In this way, one or more failed circuit control devices would not result in loss of the printed circuit board 100 or unusual and possibly unreliable repairs. Dimensions of the emergency control elements 128, 130 corresponding to the dimensions given above relative to the illustrated embodiment of FIG. 2 are approximately 0.043 inches for the diameter of the inner circular trace C and approximately 0.064 inches for the outer circular trace C' or per specifications for a given header/jumper device or board mountable switch. The emergency control elements 128, 130 also are preferably spaced from the remainder of the circuit control device 120 by a minimum masking of approximately 0.030 inches.

Having thus described the invention of the present application in detail and by reference to preferred embodiments thereof, it will be apparent that modifications and variations are possible without departing from the scope of the invention defined in the appended claims.

What is claimed is:

1. A circuit control device for a printed circuit board comprising:

a first foil pad secured to the circuit board and electrically connected to a first side of an electrical circuit to be selectively opened and closed by said circuit control device; and a second foil pad secured to the circuit board and electrically connected to a second side of said electrical circuit to be selectively opened and closed by said circuit control device, said first and second foil pads being separated from one another by a gap which is bridged by solder during an automated solder processing of said printed circuit board to close said electrical circuit, said circuit control device being opened by removal of said solder and reclosed by replacement of said solder.

2. A circuit control device for a printed circuit board as claimed in claim 1 wherein said first and second foil pads are sized to remain secured to said printed circuit board through a plurality of soldering and desoldering operations.

3. A circuit control device for a printed circuit board as claimed in claim 2 wherein said gap is a maximum of 0.006 of an inch.

4. A circuit control device for a printed circuit board as claimed in claim 2 wherein said first and second foil pads form interdigitated portions which are separated from one another by said gap such that said interdigitated portions are bridged by solder during an automated solder processing of said printed circuit board to close said electrical circuit.

5. A circuit control device for a printed circuit board as claimed in claim 2 wherein said first and second foil pads form juxtaposed fingers which are separated from one another by said gap such that said juxtaposed fingers are bridged by solder during an automated solder processing of said printed circuit board to close said electrical circuit.

6. A circuit control device for a printed circuit board as claimed in claim 2 wherein said first and second foil pads comprise buses separated from one another by interdigitated fingers alternately extending from said buses, said fingers being separated from one another by said gap such that said interdigitated fingers are bridged by solder during an automated solder processing of said printed circuit board to close said electrical circuit.

7. A circuit control device for a printed circuit board as claimed in claim 2 wherein said first foil pad comprises a first bus and said second foil pad comprises a second bus, said foil pads each further comprising at least one finger extending therefrom and pointing toward the other foil pad, said fingers being separated from one another and from the foil pads which they face by said gap.

8. A circuit control device for a printed circuit board as claimed in claim 7 wherein said fingers are generally triangular in shape and connected to their corresponding bus by a triangle vertex.

9. A circuit control device for a printed circuit board as claimed in claim 2 further comprising emergency control elements electrically connected to said first and second foil pads for receiving an emergency control device for electrically connecting said first side of said electrical circuit to said second side of said electrical circuit.

10. A circuit control device for a printed circuit board as claimed in claim 9 wherein said emergency control elements comprise:
a first conductor receiving pad connected to said first foil pad for receiving a first end of an emergency control device; and
a second conductor receiving pad connected to said second foil pad for receiving a second end of an emergency control device.

11. A circuit control device for a printed circuit board as claimed in claim 10 wherein said emergency control device comprises an electrically conducting strap.

12. A circuit control device for a printed circuit board as claimed in claim 2 wherein said gap defines at least one angled juncture to ensure solder bridging between said first and second foil pads.

13. A circuit control device for a printed circuit board as claimed in claim 12 wherein at least one of said at least one angled juncture defines an acute angle.

14. A device for opening and closing a circuit path on a printed circuit board, said device comprising:
a first foil pad connected to a first side of the circuit path to be opened and closed by said device; and
a second foil pad connected to a second side of the circuit path to be opened and closed by said device, said first and second foil pads being separated by a gap which is bridged by solder to close the circuit path and cleared of solder to open the circuit path.

15. A device for opening and closing a circuit path on a printed circuit board as claimed in claim 14 wherein said first and second foil pads are sized to remain secured to said printed circuit board after a plurality of soldering and desoldering operations.

16. A device for opening and closing a circuit path on a printed circuit board as claimed in claim 15 wherein said gap defines at least one sharply pointed juncture to ensure solder bridging between said first and second foil pads.

17. A device for opening and closing a circuit path on a printed circuit board as claimed in claim 16 wherein:
said first foil pad defines a first bus and at least one generally triangular peninsular area connected to said first bus by a vertex of said peninsular area of said first foil pad such that it expands as it extends from said first bus; and
said second foil pad defines a second bus and at least one generally triangular peninsular area connected to said second bus by a vertex of said peninsular area of said second foil pad such that it expands as it extends from said second bus, said at least one generally triangular peninsular areas of said first and second buses being formed to interengage with one another such that said gap is formed between said triangular peninsular areas.

18. A device for opening and closing a circuit path on a printed circuit board as claimed in claim 17 further comprising emergency control elements electrically connected to said first and second foil pads for receiving an emergency control device for electrically connecting said first side of said electrical circuit to said second side of said electrical circuit.

19. A device for opening and closing a circuit path on a printed circuit board as claimed in claim 18 wherein said emergency control elements comprise:
a first conductor receiving pad connected to said first foil pad for receiving a first end of an emergency control device; and
a second conductor receiving pad connected to said second foil pad for receiving a second end of an emergency control device.

20. A device for opening and closing a circuit path on a printed circuit board as claimed in claim 17 wherein said gap is a maximum of 0.006 of an inch.

* * * * *